United States Patent
Rusznyak

(10) Patent No.: US 6,759,914 B2
(45) Date of Patent: Jul. 6, 2004

(54) OSCILLATOR CIRCUIT

(75) Inventor: Andreas Rusznyak, Chene-Bougeries (CH)

(73) Assignee: Freescale Semiconductor, Inc., Austin, TX (US)

( * ) Notice: Subject to any disclaimer, the term of this patent is extended or adjusted under 35 U.S.C. 154(b) by 69 days.

(21) Appl. No.: 10/258,725
(22) PCT Filed: May 11, 2001
(86) PCT No.: PCT/EP01/05481

§ 371 (c)(1),
(2), (4) Date: Oct. 25, 2002

(87) PCT Pub. No.: WO01/86803

PCT Pub. Date: Nov. 15, 2001

(65) Prior Publication Data

US 2003/0107445 A1 Jun. 12, 2003

(30) Foreign Application Priority Data

May 12, 2000 (GB) .............................................. 0011558

(51) Int. Cl.⁷ .............................. H03B 5/00; H03B 5/36
(52) U.S. Cl. ........................... 331/116 FE; 331/116 R; 331/158; 331/175; 331/185; 331/186
(58) Field of Search ....................... 331/116 R, 116 FE, 331/117 R, 117 FE, 117 D, 158, 175, 185, 186

(56) References Cited

U.S. PATENT DOCUMENTS

| 4,095,195 A | 6/1978 | Saito |
| 4,100,502 A | 7/1978 | Yamashiro |
| 4,211,985 A | 7/1980 | Yamashiro |
| 4,459,565 A | 7/1984 | Leach |
| 5,923,222 A * | 7/1999 | Russell et al. ............... 331/185 |

FOREIGN PATENT DOCUMENTS

| JP | 54084958 | 7/1979 |
| JP | 56090604 | 7/1981 |

OTHER PUBLICATIONS

"Crystal Oscillator Device with Reliable Start–up," IBM Technical Disclosure Bulletin, vol. 33, No. 12, May 1991, pp. 378–379.

* cited by examiner

Primary Examiner—David Mis

(57) ABSTRACT

An oscillator circuit (300) comprising: a resonator (Q) connected between an input (IN) and an output (OUT); an inverter having first and second driver transistors (MP, MN) connected in series via an output-coupled node; first and second biasing transistors (MPD, MND) for biasing the driver transistors; and first and second limiting means between the gate electrodes of the driver transistors respectively and the output. The CMOS circuit allows regulation of the oscillation amplitude without need for well-controlled DC current sources to polarize correctly the driver transistors, and without need for a start-up circuit to ensure that both driver transistors remain in saturation when the circuit is powered on. A simple oscillator circuit (600) has an inverter whose input is capacitively coupled to the input (IN), first limiting means coupled between the inverter input and the output (OUT), and second limiting means coupled between the input (IN) and the output (OUT).

13 Claims, 2 Drawing Sheets

-PRIOR ART-

-PRIOR ARTent
OSCILLATOR CIRCUIT

FIELD OF INVENTION

This invention relates to oscillator circuits for use in integrated circuits.

BACKGROUND OF INVENTION

One of the most frequently-used analog circuits in today's IC's is the Pierce-type two-pin oscillator. Typically, this type of oscillator is used to generate clock signals in microprocessors and other integrated systems.

Such an oscillator is typically formed by a resonator embedded between two capacitors connected to ground and between the input and output of an inverter. FIG. 1 shows the schematic circuit of such an oscillator.

This oscillator is of simple construction, but presents several disadvantages:

The amplitude at the output is limited by non-linearities generating harmonics which may cause electromagnetic coupling (EMC) problems.

The amplitude across the resonator is high, resulting in high power dissipation in the resonator, limiting its long-term frequency stability.

Since both transistors constituting the inverter conduct simultaneously during a large portion of the period of oscillation, the oscillator has high current consumption.

A high impedance current path is needed between the input and output of the inverter to ensure its correct biasing. Leakage of external components connected to this path may alter operating conditions of the oscillator.

Several solutions have been proposed to deal with these disadvantages. FIG. 2 shows a prior art circuit known from U.S. Pat. No. 4,405,906 which avoids the above mentioned drawbacks by regulation of the oscillation amplitude. In this known circuit two DC bias current sources polarize the driver transistors, whereas the currents from these current sources are sunk to the supply rails across transistors connected between the driver transistors common drain and their gate.

This known circuit presents two important drawbacks. Firstly, well-controlled DC current sources are needed to polarize correctly the driver transistors. Secondly, a start-up circuit is needed to ensure that both driver transistors remain in saturation when the circuit is powered on.

From U.S. Pat. No. 3,902,141 there is known a quartz oscillator circuit having an amplifier formed by two complementary semiconductors whose sources, gates and drains are connected in parallel in an alternate arrangement with a power supply, a quartz crystal connected between the drains and the gates, a detection capacitor connected between the gates and the sources and a charge capacitor connected between the sources and the drains. An integration capacitor is connected between the semiconductors' gates so as to control the class of operation of the amplifier in dependence on the oscillation amplitude.

A very low current Pierce oscillator is known from U.S. Pat. No. 4,360,789.

It is an object of the present invention to provide an oscillator circuit wherein the above-mentioned disadvantages may be overcome or at least alleviated.

SUMMARY OF INVENTION

In accordance with a first aspect of the invention there is provided an oscillator circuit as claimed in claim 1.

In accordance with a second aspect of the invention there is provided an oscillator circuit as claimed in claim 11.

BRIEF DESCRIPTION OF DRAWINGS

Five oscillator circuits incorporating the invention will now be described, by way of example only, with reference to the accompanying drawings, in which.

DETAILED DESCRIPTION

Figure 1:
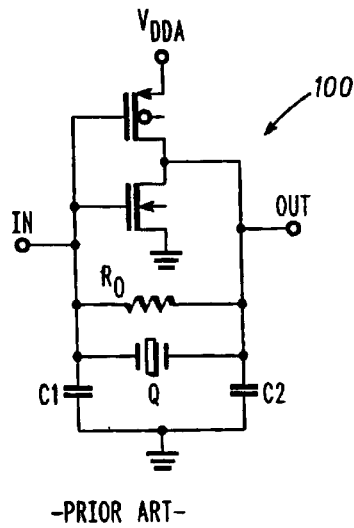
FIG. 1 shows a schematic circuit diagram of a known Pierce-type two-pin oscillator circuit.

Referring to FIG. 1, a Pierce-type two-pin oscillator 100 is formed by a resonator Q embedded between two capacitors C1 and C2. The capacitors are commonly connected at terminals remote from the resonator Q to a voltage node VSS. A CMOS transistor pair MP, MN have their source and drain electrodes connected in series between voltage nodes VDDA and VSS. The CMOS transistors MP and MN form an inverter whose input IN is connected to the transistors' gate electrodes and whose output OUT is connected to a point between the transistors' current electrodes. The input IN and output OUT are connected respectively to the capacitors C1 and C2 at terminals remote from the voltage node VSS. A resistance R0 is connected between the input IN and output OUT.

As discussed above, although the known Pierce-type two-pin oscillator 100 has the advantage of simple construction, it presents several disadvantages: (i) the amplitude at the output is limited by non-linearities generating harmonics which may cause electromagnetic coupling (EMC) problems; (ii) the amplitude across the resonator Q is high, resulting in high power dissipation in the resonator, limiting its long-term frequency stability; (iii) since both transistors MP and MN constituting the inverter conduct simultaneously during a large portion of the period of oscillation, the oscillator has high current consumption; and (iv) a high impedance current path R is needed between the input IN and output OUT of the inverter to ensure its correct biasing, and leakage of external components connected to this path may alter operating conditions of the oscillator.

Figure 2:
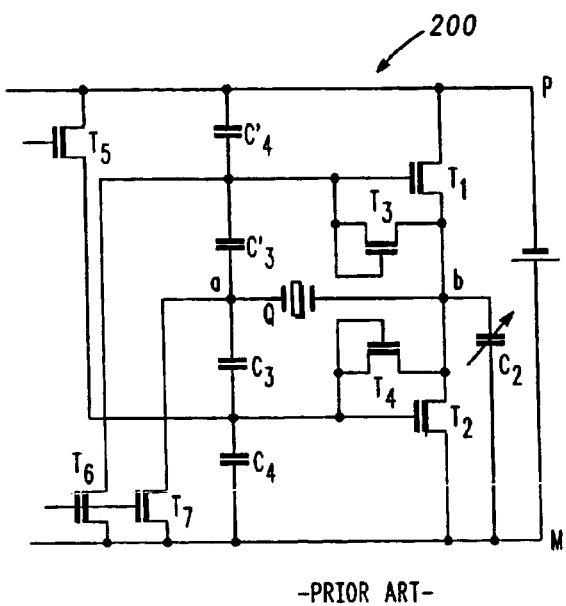
FIG. 2 shows a schematic circuit diagram of a known oscillator circuit with amplitude regulation.

Referring now to FIG. 2, a known oscillator circuit 200 avoids these disadvantages. The oscillator circuit 200, resonator Q, transistors T1 and T2 and capacitor C2 in are analogous to respectively the resonator Q, the transistors MP and MN, and the capacitor C2 in FIG. 1. The capacitors C3' and C4' (together with capacitors C3 and C4) in FIG. 2 are analogous to the capacitor C1 in FIG. 1. In the oscillator circuit 200, nodes a and b serve as input and output nodes respectively.

The oscillator circuit 200 avoids the above-discussed drawbacks of the oscillator circuit 100 by regulation of the oscillation amplitude. In the oscillator circuit 200 the oscillation amplitude is regulated by two DC bias current sources (formed by transistors T3 and T4 respectively) which polarize the driver transistors T1 and T2, whereas the currents from these current sources are sunk to the supply rails P and M across transistors T5, T6 and T8 connected between the driver transistors' common drain and their gate.

However, as discussed above, although the oscillator circuit 200 avoids the disadvantages of the oscillator circuit 100, the oscillator circuit 200 has two important drawbacks. Firstly, well-controlled DC current sources T3 and T4 are needed to polarize correctly the driver transistors T1 and T2. Secondly, a start-up circuit (not shown) is needed to ensure that both driver transistors remain in saturation when the circuit is powered on.

Figure 3:
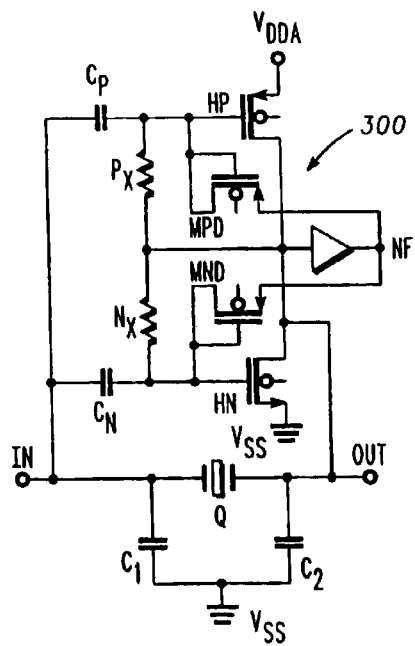
FIG. 3 shows a schematic circuit diagram of a first oscillator circuit embodying the present invention.

Referring now to FIG. 3, an oscillator circuit 300 exhibits the above-discussed advantages of the known circuits of FIG. 1 and FIG. 2, but avoids their above-discussed disadvantages.

In the oscillator circuit 300 a resonator Q is embedded between two capacitors C1 and C2. The capacitors are commonly connected at terminals remote from the resonator Q to a voltage node VSS. A CMOS transistor pair MP, MN have their source and drain electrodes connected in series between voltage nodes VDDA and VSS. The CMOS transistors MP and MN form an inverter whose input IN is connected to the transistors' gate electrodes via respective capacitors CP and CN, and whose output OUT is connected to a point between the transistors' current electrodes. The input IN and output OUT are connected respectively to the capacitors C1 and C2 at terminals remote from the voltage node VSS. The gate electrodes of the transistors MP and MN (at nodes PG and NG respectively) are connected via two series-connected resistances PX and NX. A point between the resistances PX and NX is connected to the output OUT. The gate electrodes of the transistors MP and MN (at nodes PG and NG respectively) are connected respectively via diode-connected CMOS transistors MND and MNP to node NF, which is connected to the output OUT via an amplifier A.

In the oscillator 300 of FIG. 3, the correct biasing condition of the driver transistors MN and MP is ensured by high impedance paths through the transistors NX and PX between the output of these driver transistors and their gates. In this way at start-up both driver transistors MN and MP are in saturation.

The transistors MND and MPD, connected in diode configuration, accomplish the amplitude regulation in a similar way to that in the prior art circuit of FIG. 1. The transistors MND and MPD, connected between the gates of the driver transistors MN and MP and the node NF, are able to sink the current sourced by the high impedance paths when the amplitude on the oscillator output OUT rises. In steady state condition, the charge transferred periodically through the transistors MND and MPD is equal to that provided by the high impedance paths through the resistances NX and PX respectively.

It will be understood that in this way the oscillator circuit 300 of FIG. 3 exhibits the above-discussed advantages of the known circuits of FIG. 1 and FIG. 2, but avoids their above-discussed disadvantages.

Figure 4:
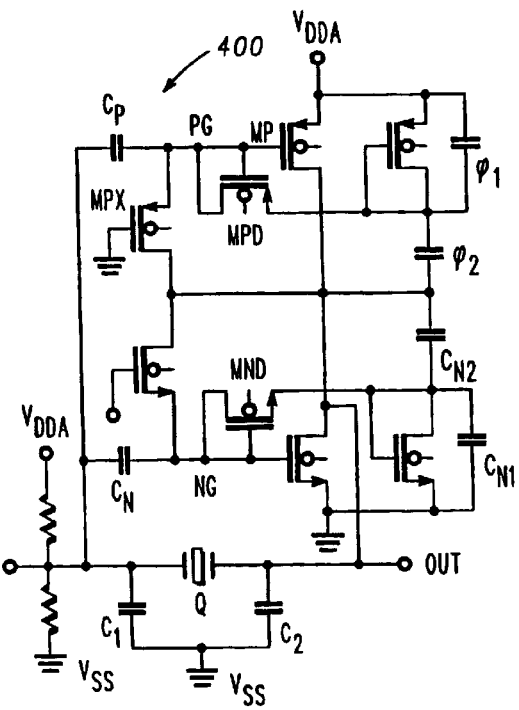
FIG. 4 shows a schematic circuit diagram of a second oscillator circuit embodying the present invention.

FIG. 4 shows a practical embodiment of the oscillator circuit 300 of FIG. 3. In the oscillator circuit 400 of FIG. 4, the high impedance resistances PX and NX of the oscillator circuit 300 of FIG. 3 between the output of the driver transistors MPD, MND and their gates are realized by adequately controlled, long channel CMOS transistors MPX and MNX respectively. Further, in the oscillator circuit 400 of FIG. 4, connections to the transistors MPD and MND are arranged as follows.

In parallel with the driver transistors MP and MN, a pair of CMOS transistors MP1 and MN1 and capacitors CP2 and CN2 are connected in series. The transistor MP1 has its gate electrode connected to its source electrode (at a node PF) and to the drain electrode of the driver transistor MPD. A capacitor CP1 is connected between the source and drain electrodes of the transistor MP1. The transistor MN1 has its gate electrode connected to its source electrode (at a node NF) and to the drain electrode of the driver transistor MND. A capacitor CN1 is connected between the source and drain electrodes of the transistor MN1.

In the oscillator circuit 400 of FIG. 4, amplitude regulation occurs by means of the charge stored in capacitors CN2, CP2 and transferred to nodes NG, PG. It will be understood that in this embodiment there is no need to build amplifiers. Current consumption of the complete circuit under the conditions as already defined above is 0.25 mA when the voltage on IN and on OUT oscillates between 10% and 90% of the supply voltage.

Figure 5:
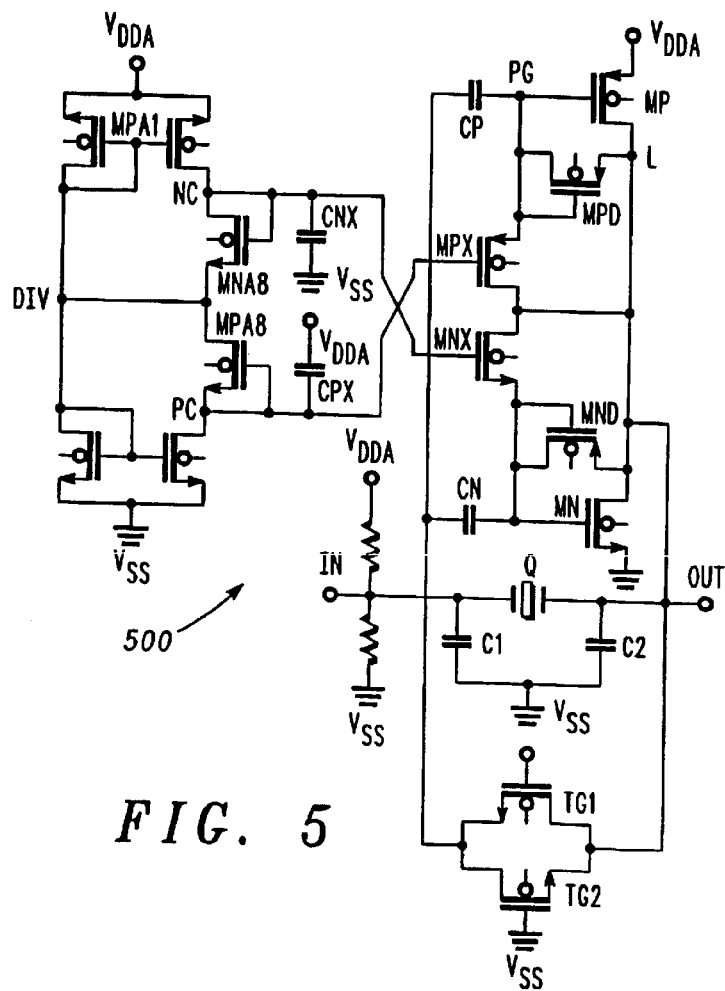
FIG. 5 shows a schematic circuit diagram of a third oscillator circuit embodying the present invention.

FIG. 5 shows another practical embodiment of the oscillator circuit 300 of FIG. 3. In the oscillator circuit 500 of FIG. 5, connections to the transistors MPD and MND are arranged as follows.

Between the gate electrodes of the driver transistors MP and MN (at the nodes PG and NG), a pair of CMOS transistors MPX and MNX are connected in series, a point between the transistors MPX and MNX being connected to a point between the driver transistors MP and MN. Between the gate electrodes of the transistors MPX and MNX (at the nodes PC and NC), a pair of diode-connected CMOS transistors MNA0 and MPA0 are connected in series, a point between the transistors MNA0 and MPA0 forming a node DIV. Transistors MPA1 and MPA2 have their gate electrodes commonly connected to the node DIV, and have their source electrodes commonly coupled to the voltage node VDDA. The transistor MPA1 has its drain electrode connected to the node DIV. The transistor MPA2 has its drain electrode connected to the node NC. Transistors MNA1 and MNA2 have their gate electrodes commonly connected to the node DIV, and have their source electrodes commonly coupled to the voltage node VSS. The transistor MNA1 has its drain electrode connected to the node DIV. The transistor MNA2 has its drain electrode connected to the node PC.

In operation of the oscillator circuit 500 of FIG. 5, the growing voltage on the output terminal OUT causes transistors MND, MPD to open and so to sink the current provided by transistors MNX and MPX, respectively.

The control voltage of transistors MNX, MPX representing high-impedance connections between the oscillator output and the gates of the driver transistors, is adjusted to be at the DC voltage on the output terminal OUT at start-up plus the threshold voltage of transistors MNX, MPX. In this way, the currents provided by these transistors track process, temperature and supply voltage variations, so as to counter performance variations elsewhere in the circuit.

It will be appreciated that, if required, the current provided by transistors MNX and MPX can be stabilized by means of an auxiliary circuit (not shown) generating a DC current proportional to the value of an integrated capacitor, to the supply voltage and to the frequency of the oscillator itself.

A further feature of the oscillator circuit 500 of FIG. 5 is the incorporation of a resistive transmission gate, formed by CMOS transistors TG1 and TG2, connected between the input IN and output OUT. The gate electrodes of the transistors TG1 and TG2 are connected respectively to supply voltages VDDA and VSS. It will be understood that the effect of this transmission gate is to define the voltage on the input at low frequencies. It will further be understood that, if desired, such a transmission gate could be incorporated into the oscillator circuit 300 of FIG. 3 and/or the oscillator circuit 400 of FIG. 4.

It will be understood that all of the oscillator circuits of FIG. 3, FIG. 4 and FIG. 5 provide simple and effective regulation of the oscillator amplitude without need for well-controlled DC current sources to polarize correctly the driver transistors, and without need for a start-up circuit to ensure that both driver transistors remain in saturation when the circuit is powered on.

Figure 6:
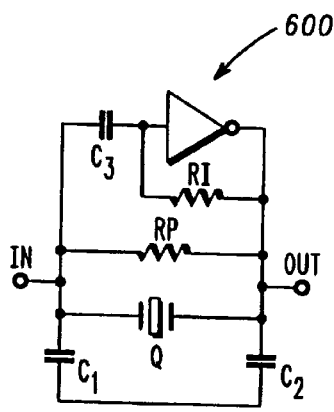
FIG. 6 shows a schematic circuit diagram of a simple, fourth oscillator circuit embodying the present invention.

Referring now also to FIG. 6, a second aspect of the invention is based on the realisation that present technology allows capacitive coupling on the input without major disadvantages, at least for frequencies in the 1 MHz range or above. In practice this is not a significant drawback since most microprocessors and digital signal processors presently operate above 4 MHz.

As shown in FIG. 6, in the oscillator circuit 600 a resonator Q is embedded between two capacitors C1 and C2. The capacitors are commonly connected at terminals remote from the resonator Q. The capacitors C1 and C2 are respectively connected, at terminals remote from their commonly connected terminals, to an input node IN and an output node OUT. A CMOS inverter INV is connected between the input node IN and the output node OUT via a capacitor C3 connected to the input node IN. A resistor RI is connected in parallel with the inverter INV, and a resistor RL is connected between the input node IN and an output node OUT. As in the oscillator circuits of FIGS. 3, 4, and 5 above, it will be understood that the resistors RI and RL may take the form of high impedance transistors.

It will be understood that the simple oscillator circuit 600 provides (i) capacitive coupling (via the capacitor C3) on the input IN and (ii) high impedance coupling (via the resistor RL) between output OUT and input IN, and between output OUT and internal (capacitively coupled) input. In this way it will be appreciated that the inverter 600 is insensitive to leakage and exhibits improved susceptibility to electromagnetic coupling. Additionally, amplitude regulation helps to improve frequency stability.

Figure 7:
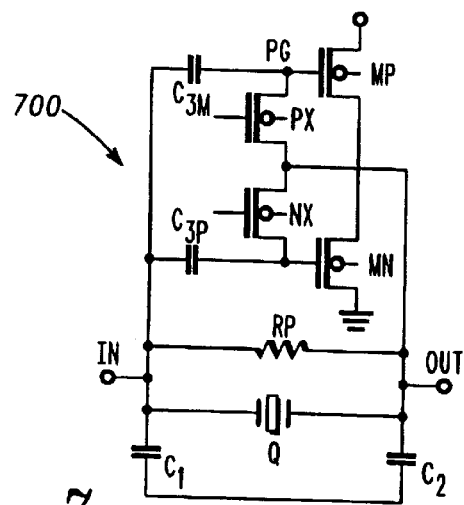
FIG. 7 shows a schematic circuit diagram of a fifth oscillator circuit, based upon the simple oscillator circuit of FIG. 6, embodying the present invention and incorporating componentry to provide improved amplitude regulation.

Referring now also to FIG. 7, a fifth oscillator circuit 700, based on the simple oscillator circuit 600 of FIG. 6, has componentry to provide improved amplitude regulation. Thus, in the oscillator circuit 700 the inverter INV of the oscillator circuit 600 is formed by a CMOS transistor pair MP, MN connected with their current electrodes in series via the output node OUT. The gate electrodes PG and NG of the transistors MP and MN are respectively connected to the input node IN via individual coupling capacitors C3P and C3N. Each of the transistors MP, MN has its gate electrode connected to the output node OUT via respective CMOS transistors PX, NX.

It will be appreciated that by providing separate capacitive input coupling to the transistors MP and MN, and separate output coupling of the gate electrodes PG and NG of the transistors MP and MN, improved amplitude regulation is obtained. Thus, it will be appreciated that the oscillator circuit 700 provides leakage insensitivity, improved susceptibility to electromagnetic coupling, good stability of operation and (like the oscillator circuits 300, 400, 500 and 600) requires no start-up circuitry.

It will be understood that in the oscillator circuit 700 amplitude regulation may be achieved either by (i) having the voltages on the gate electrodes of the transistors PX and NX vary as a function of the voltages respectively on the gate electrodes of the transistors MP and MN, or (ii) having the voltages on the gate electrodes of the transistors PX and NX fixed and having diodes (not shown) between the gate electrodes of the transistors MP and MN and the output node OUT.

It will be understood that all of the oscillator circuits of FIG. 3, FIG. 4, FIG. 5, FIG. 6 and FIG. 7 can be fabricated entirely in CMOS integrated circuit process technology, minimising the size of semiconductor die which the oscillator circuit requires and reducing the circuit's power requirements.

What is claimed is:

1. An oscillator circuit comprising:

an input and an output arranged for connection of a resonator therebetween;

inverter means having a first driver transistor and a second driver transistor coupled in series via said output;

biasing means having a first biasing element coupled between said output and a control electrode of the first driver transistor for biasing the first driver transistor, and a second biasing element coupled between said output and the control electrode of the second driver transistor for biasing the second driver transistor;

first limiting means coupled between the control electrode of said first driver transistor and a first node for receiving a signal representative of the signal at the output, and second limiting means coupled between the control electrode of said second driver transistor and a second node for receiving a signal representative of the signal at the output, the control inputs of the first and second driver transistors being capacitively coupled to the input.

2. An oscillator circuit according to claim 1 further comprising amplifier means having an input coupled to the output and having an output coupled to the nodes for receiving a signal representative of the signal at the output.

3. An oscillator circuit according to claim 1 further comprising:

first capacitive means coupled between the output and said first node for receiving a signal representative of the signal at the output;

first current defining means for defining the current flowing in the first limiting means;

second capacitive means coupled between the output and said second node for receiving a signal representative of the signal at the output; and second current defining means for defining the current flowing in the second limiting means.

4. An oscillator circuit according to claim 3 wherein the first current defining means comprises a diode-connected transistor and a capacitor between the first node for receiving a signal representative of the signal at the output and a first supply node, and the second current defining means comprises a diode-connected transistor and a capacitor between the second node for receiving a signal representative of the signal at the output and a second supply node.

5. An oscillator circuit according to claim 1, wherein the biasing means comprises resistive transistors having control electrodes.

6. An oscillator circuit according to claim 5 wherein the control electrodes of the resistive transistors of the first and second biasing means are respectively coupled to the second and first supply nodes.

7. An oscillator circuit according to claim 5 wherein the control electrodes of the resistive transistors are coupled to means for providing control voltages for ensuring that the resistive transistors conduct when the voltage on the control electrodes of the driver transistors is less than a start-up voltage on the output.

8. An oscillator circuit according to claim 7 wherein the means for providing control voltages comprises:

means for providing a voltage representative of the start-up voltage and voltages representative of the threshold voltages of the biasing means, and means for generating therefrom the control voltages.

9. An oscillator circuit according to claim 1, further comprising a resistive transmission gate coupled between the input and the output to define the voltage on the input at low frequencies.

10. An oscillator circuit according to claim 9 wherein the resistive transmission gate has control electrodes which are coupled respectively to the first and second supply nodes.

11. An oscillator circuit comprising:

an input and an output arranged for connection of a resonator therebetween;

inverter means having an input and having an output coupled to the output of the circuit;

capacitance means coupled between the input of the circuit and the input of the inverter;

first limiting means coupled between the input of the inverter and the output of the circuit; and second limiting means coupled between the input of the circuit and the output of the circuit.

12. An oscillator circuit according to claim 11 wherein the inverter comprises first and second series-connected transistors, the capacitance means comprises first and second capacitances coupled between the input of the circuit and the control electrodes of the first and second transistors respectively, and the first limiting means comprises first and second transistors coupled between the output of the circuit and the control electrodes of the first and second transistors respectively.

13. An oscillator circuit according to claim 12, wherein the transistors are CMOS transistors.

* * * * *